United States Patent
Berkhahn et al.

(10) Patent No.: US 8,670,956 B2
(45) Date of Patent: Mar. 11, 2014

(54) LIGHT MONITORING SYSTEM AND METHOD FOR OPERATING SAME

(75) Inventors: Sven-Olaf Berkhahn, Ohlendorf (DE); Stefan Schulz, Himmelpforten (DE); Peter O. Owotoki, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 1875 days.

(21) Appl. No.: 11/923,749

(22) Filed: Oct. 25, 2007

(65) Prior Publication Data

US 2008/0278350 A1 Nov. 13, 2008

Related U.S. Application Data

(60) Provisional application No. 60/863,223, filed on Oct. 27, 2006.

(30) Foreign Application Priority Data

Oct. 27, 2006 (EP) .................................. 06022555

(51) Int. Cl.
*G06F 19/00* (2011.01)

(52) U.S. Cl.
CPC ............................ *G06F 19/00* (2013.01)
USPC .......................................................... 702/183

(58) Field of Classification Search
USPC ........................................ 702/182–185, 188
See application file for complete search history.

(56) References Cited

U.S. PATENT DOCUMENTS

| 7,178,941 | B2 * | 2/2007 | Roberge et al. ............... 362/225 |
| 2005/0122064 | A1 | 6/2005 | Chevalier et al. |
| 2007/0145915 | A1 * | 6/2007 | Roberge et al. ............... 315/312 |

FOREIGN PATENT DOCUMENTS

| EP | 1528841 A2 | 5/2005 |
| WO | 98/49872 A1 | 11/1998 |

* cited by examiner

*Primary Examiner* — Edward Raymond
(74) *Attorney, Agent, or Firm* — Christopher Paradies; Paradies Law P.A.

(57) ABSTRACT

A method for monitoring the operating health of a lighting system having a plurality of operating components, in one example includes acquiring test data from a plurality of operating components at a plurality of different operating states of the lighting system, and a data set is acquired for each operating state of the lighting system, and a plurality of data sets are acquired. A model of the lighting system may be constructed using the plurality of data sets.

13 Claims, 1 Drawing Sheet

LIGHT MONITORING SYSTEM AND METHOD FOR OPERATING SAME

REFERENCE TO RELATED APPLICATIONS

This application claims the benefit of the filing date of European Patent Application No. EP 06 022 555.4 filed Oct. 27, 2006 and of U.S. Provisional Patent Application No. 60/863,223 filed Oct. 27, 2006, the disclosure of which applications is hereby incorporated herein by reference.

FIELD OF THE INVENTION

The field relates to monitoring systems.

BACKGROUND OF THE INVENTION

Lighting systems play an important role in the experience of the cabin space on aircraft systems. They ensure passenger comfort, enable communication with the crew and enhance security. Aircraft manufactures and airliners have identified this as a means of gaining competitive advantage, e.g., through improving the passenger experience with new lighting features to improve the individual passenger's comfort or by creating the desired moods and ambience in shared cabin spaces. Some of these features are already being developed for new aircrafts like the A380 and the 7E7, more are proposed for aircrafts still in conception.

To achieve the full benefit from these lighting systems, the degradation of the individual lighting components (LEDs) should be monitored closely, as subtle changes in the luminescence of different components may distort the effects being aimed at by the lighting system. Aside from monitoring individual lighting components, the continuous monitoring of other components in the unit is important in order to preemptively identify faults or health states that impact the lighting system as a whole and to correct this in a preventive maintenance process.

A conventional approach in monitoring the degradation of lighting systems is based on using data from endurance tests of sample LEDs carried out after production and used to predict the useful economic life of the LEDs. This process may involve randomly selecting LEDs from the production run and exposing them to a series of tests in a specially constructed measuring station. Testing conditions may include the following variables: current flow, power output, ambient temperature and stress on the LEDs. By programming the conditions in the measuring station with extreme values of the controlling variables (e.g. using very high or very low temperature values), the aging process of the devices may be accelerated, this way data for the rate of degradation of the LED's are collected and used to predict the theoretical life span of the devices. This data are then used to develop a policy for the maintenance of the devices and their replacement, when required, at strictly defined times in a scheduled maintenance process. Monitoring of other non-lighting components (e.g. the illumination ballast unit, or IBU), may be separately performed and collected, each component being graded as to its individual health state, faulty, normal etc.

The conventional method is characterized by the following: For example, the endurance tests on the lighting elements to derive life-cycle estimation data carried out in a simulated environment to accelerate the aging process on the devices may not reflect the operating environment of the lighting systems in the aircraft cabin. Hence, the obtained data which is the basis of the monitoring and maintenance process may not match the run time experience of the LEDs and of the lighting systems containing them. This may lead to inaccuracies in predicting mean-time-to-failure (MTTF) estimates of components and the lighting system, resulting in greater complexity (in time, intractability, etc) and costs of the maintenance process.

A further feature of the aforementioned convention approach may be that the maintenance logic and accelerate test data used for this purpose are fixed at build time and there is no provision made to learn from the experience of operating the system to improve its monitoring and maintenance. Data and information collected during the current operating life of the system may not be used to provide a more accurate prediction of the components' or system's health state or MTTF.

SUMMARY OF THE INVENTION

In accordance with one embodiment, a method for monitoring the operating state of a lighting system includes the operation of acquiring test data from a plurality of operating components of the lighting system over a plurality of different operating states for the lighting system. The method further includes constructing a model of the lighting system using the acquired test data. The method further includes acquiring runtime data from the lighting system, and applying the runtime data to the model of the lighting system. The model of the lighting system is operable to output operating state data responsive to the input of the operating data, the operating state data indicating the operating health of the lighting system.

In accordance with another embodiment, a system operable to monitor the operating health of a lighting system includes a plurality of sensors and a processor. The sensors are operable to acquire data from the plurality of operating components of the lighting system. The processor is coupled to the plurality of sensors, and is operable to acquire test data from the plurality of sensors, and operable to construct a model of the lighting system using said acquired test data. The processor is further operable to acquire runtime data of the lighting system from the plurality of sensors, and to output operating state data indicating the operating health of the lighting system responsive to acquiring the runtime data of the lighting system, whereby a set of test data may be acquired for each operating state.

The following describes examples of features of the monitoring method, although these features and refinements will apply to the monitoring system as well. In one embodiment, the operating components of the lighting system includes at least one light emitting element and at least one non-light emitting element. Furthermore, the operation of acquiring test data may include acquiring data selected from the group of test data consisting of the luminescence of the light emitting element, the intensity of the light emitting element, the current supplied to the light emitting element, the voltage developed across the light emitting element, or the operating temperature of the light emitting element. In one example, the operation of acquiring runtime data may include acquiring data of the aforementioned types, i.e., luminescence of the light emitting element, the intensity of the light emitting element, the current supplied to the light emitting element, the voltage developed across the light emitting element, or the operating temperature of the light emitting element. Acquisition of test data for the light emitting element enables the construction of an accurate aging model for the light emitting elements. Applying of this type of data during runtime operations permits accurate aging prediction of the light emitting elements in the lighting system.

In a further embodiment, the operating components of the lighting system include an illumination ballast unit having a first input coupled to receive commands, a second input coupled to receive power, and an output coupled to at least one of the light emitting elements, the illumination ballast unit further including a processor. In this embodiment, the operation of acquiring test data may include acquiring data selected from a group of test data consisting of the command signal supplied to the first input, the current supplied to the second input, the current or voltage supplied to the second input, the temperature of the processor, the power consumption of the processor, or the temperature of the illumination ballast unit. Further particularly in such an embodiment, the operation of acquiring runtime data may include acquiring data of the aforementioned types, i.e., temperature and power consumption of illumination ballast unit and processor. Acquisition of test data for the illumination ballast unit and processor enables the construction of an accurate aging model for the these elements. Additionally, when test data from the light emitting element, the illumination ballast unit, and the processor are acquired, the model which is constructed from such a collection of test data will include correlation effects as to how each component influences the other in particular health/operating states.

In further embodiments, the operating/health states may include normal and faulting operating/health states for each of the operating components. Further embodiment, runtime data may be acquired either at a predefined time interval or upon sensing a predefined lighting system operating condition.

The following describes embodiment features of the monitoring system, although these features and refinements will apply to the monitoring method as well. In one embodiment, the lighting system includes at least one light emitting element and an illumination ballast unit, the illumination ballast unit having a first input coupled to receive commands, a second input coupled to receive power, and an output coupled to at least one of the light emitting elements. Further embodiment, the sensors are operable to detect runtime data of the lighting system selected from the group of data consisting of luminescence of the light emitting element, intensity of the light emitting element, current supplied to the light emitting element, voltage developed across the light emitting element, operating temperature of the light emitting element, the presence of absence of a command signal supplied to the first input, voltage or current supplied to the second input of the illumination ballast unit, and the temperature of the illumination ballast unit.

The operations of the foregoing methods may be realized by a computer program, i.e. by software, hardware, or in hybrid/firmware form. The computer program may be implemented as computer readable instruction code in any suitable programming language, such as, for example, VHDL, assembler, JAVA, C++, and may be stored on a computer-readable medium (removable disk, volatile or non-volatile memory, embedded memory/processor, etc.) or encoded as modulation on a carrier signal, the instruction code operable to program a computer or other such programmable device to carry out the intended functions. The computer program may be available from a network (e.g., WorldWideWeb (via a secure link), or an airline network such as SITA or ARINC) from which it may be downloaded.

These and other features of the light monitoring system will be better understood in light of the following drawings and detailed description of embodiments.

For clarity, previously-identified features retain their reference indicia in subsequent drawings.

DETAILED DESCRIPTION

The examples described and drawings rendered are illustrative and are not to be read as limiting the scope of the light monitoring system as it is defined by the appended claims.

Figure 1:
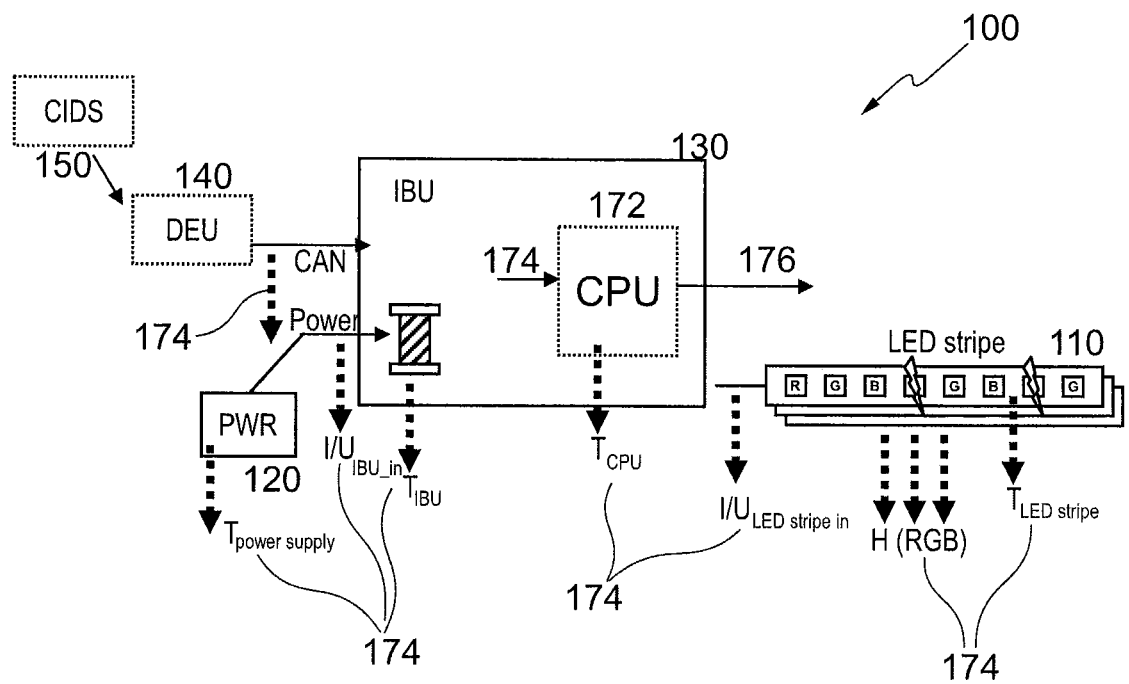
FIG. 1 illustrates an example of the light system.

FIG. 1 illustrates an example of light system 100. The lighting system 100 includes at least one light emitting element 110 operable to emit light. In a specific embodiment, the light emitting element 110 is an element which exhibits a gradual aging characteristic. Examples of such light emitting elements include light sources such as light emitting diodes, laser diodes, organic light emitting diodes, AC light emitting diodes, and the like. Optionally, other light sources which provide a more abrupt end-of-life response, such as a fluorescent tube or incandescent lighting, may be employed in combination with the aforementioned light emitting elements. It will be appreciate that the light emitting element 110 may be included within a larger matrix of elements, for example, an LED light matrix.

The lighting system 100 further includes a power supply 120 operable to provide regulated or unregulated power (in either time-varying ac or time-invariant dc formats) to power the lighting system 100. The lighting system 100 also includes an illumination ballast unit 130 coupled between the light emitting element(s) 110 and the power supply 120, the IBU 130 operable to provide proper loading to the power supply 120. The illumination ballast unit 130 includes a first input 130a coupled to a cabin inter communication data system (CIDS) 140 for receiving commands for setting the power delivered to the light emitting elements 110, a second input 130b coupled to the power supply 120 for receiving power, and an output 130c coupled to at least one of the light emitting elements 110.

The lighting system 100 includes a cabin inter communication data system (CIDS) 140, and a decoder/encoder unit (DEU) 150, where these units are operable to provide command instructions to the desired light emitting elements 110. The DEU 150 communicates to the IBU 130 via a command bus (e.g., a controller area network, or CAN bus), this bus network coupled to other IBUs (not shown) in parallel.

The monitoring system employed within the lighting system is composed, in one embodiment, of a processor 172 and sensors 174. Processor 172 is operable to construct and store a model of the lighting system, and in a particular embodiment, is embedded on the IBU 130, although in other embodiments, the functional structure (hardware software, or firmware) may be located remotely from the system altogether. The processor 172 is coupled to sensors 174 which supply the processor test data for construction of a model of the lighting system, as will be described in greater detail below. The sensors 174 are further operable to supply runtime data during operation of the lighting system to the processor 172, whereby the simulated model of the lighting system stored within the processor 172 is operable to output operating state data 176 in response to receiving the runtime data obtained by the sensors 174, the operating state data 176 providing information as to the operating health of the lighting system 100. As will be appreciated, the same or different sensors 174 may be employed for sensing test data and runtime data during model construction and operational modes, respectively.

The sensors 174 may be operable in different modalities. For example in the illustrated embodiment shown in FIG. 1, sensors 174 may be operable to detect the presence or absence of a command signal present on a first input 130*a* of the IBU 130 (i.e., 174 *a*). In an embodiment, sensors 174 may be operable to detect the voltage and/or current supplied (i.e., 174*c*) from the power supply 120 to a (power) input 130*b* of the IBU 130. Similarly, sensors 174 may be configured so as to detect the voltage and/or current supplied (i.e., 174 *f*) from an output 130*c* of the IBU to the light emitting elements 110. Sensors 174 may also be configured to detect temperatures, for example the operating temperatures of the light emitting elements 110, (i.e., 174*k*) the IBU 130 (i.e., 174*d*), the power supply (i.e., 174 *b*) and the processor (i.e., 174 *e*). In a further embodiment, sensors 174 are operable to detect the intensity of light emitting from the light emitting elements 110 shown schematically at 174 *h*. When the light emitting element is a light emitting diode, the sensor may be operable to detect the intensity of a particular LED color, e.g., red, green, or blue, (i.e., shown schematically at 174 *i, j*), the sensor 174 may either tune to sense the LED's particular color, or employ a color filter.

Figure 2:
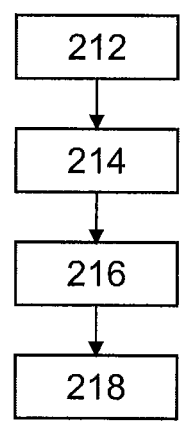
FIG. 2 illustrates an example of method for controlling the light monitoring system in accordance with one embodiment.

FIG. 2 illustrates a method for controlling the light monitoring system in accordance with one embodiment. Initially at 212, test data is acquired from a plurality of operating components (e.g., light emitting element(s) 110, and IBU 130) of the lighting system 100, the test data obtained at a plurality of different operating states of the lighting system 100. The term "operating state" of the lighting system refers to the state, condition or health of the lighting system. At a basic level, the operating state of the lighting system may be defined as nominal or inoperable. Other examples of operating states include "normal operation," "fault detected," "power overload detected," "power cut-off," "dead light element," "dimmed light condition." It will be appreciated that other operating states may be employed in accordance with the light monitoring system as well.

During the operation of 212, a set of test data is acquired for each operating state, and collectively, a plurality of data sets are acquired for the lighting system corresponding to a plurality of different operating states. At 214, a model is constructed using the plurality of the test data sets, and an embodiment of this operation is described below. At 216, runtime data (i.e., data taken from the lighting system 100 during its operation) is acquired. At 218, the runtime data is applied to the model of the lighting system 100. The model of the lighting system is operable to output operating state or "health" data 176 responsive to the input of the runtime data, the operating state data 176 indicating the operating health of the lighting system 100.

It will be appreciated that one or more of the operations 212-218 may be repeated. For example, for a particular model construction, operations 216 and 218 may be repeated multiple times to collect presently occurring runtime data and to provide the health state of the lighting system 100. In another embodiment, operations 212 and 214 may be repeated, whereby new test data is obtained, and an updated model is generated. In such an embodiment, the test data may be runtime data obtained from the on-line lighting system 100. Such a procedure may be beneficial, for example, when a change in the aging process is detected or foreseen. Still further alternatively, all of the operations 212-218 may be repeated, whereby new test data is acquired, a new model of the lighting system obtained, and a new reading of the operating state of the lighting system obtained. The repetition of the aforementioned operations may occur by several different means, for example, at predefined intervals (based upon, e.g., chronologic time, or runtime of the lighting system, etc.), upon a predefined event (e.g., accelerated aging or detected failure of an operating component failure), or other conditions, such as start-up.

In a particular embodiment, operation 212 is performed by acquiring data from at least one light emitting element 110 and at least one non-light emitting element, e.g., the IBU 130. In such an embodiment, the test data acquired in operation 212 from the at least one light emitting element 110 may include the luminescence of the light emitting element 110, and/or the intensity of the light emitting element 110, and/or the current supplied to the light emitting element 110, and/or the voltage developed across the light emitting element 110, and/or the operating temperature of the light emitting element 110. Furthermore, the test data acquired from the IBU 130 may include a command signal supplied to the first input 130*a* of the IBU 130, a current supplied to the second input 130*b* of the IBU 130, a voltage supplied at the second input 130*b* of the IBU 130, a temperature of the processor 172 housed on the IBU 130, power consumption of (voltage and/or current supplied to) the processor 172, and a temperature of the illumination ballast unit 130.

In a particular embodiment of operation 216, runtime data is acquired from at least one light emitting element 110 and at least one non-light emitting element, e.g., IBU 130. In such an embodiment, the runtime data acquired from the at least one light emitting element 110 may include the luminescence of the light emitting element 110, and/or the intensity of the light emitting element 110 (indicated as parameter 174*h* in FIG. 1), and/or the current supplied to the light emitting element 110, and/or the voltage developed across the light emitting element 110, and/or the operating temperature of the light emitting element 110. Furthermore, the runtime data acquired from the IBU 130 may include a command signal supplied to the first input 130*a* of the IBU 130, a current supplied to the second input 130*b* of the IBU 130, a voltage supplied at the second input 130*b* of the IBU 130, a temperature of the processor 172 housed on the IBU 130, power consumption of (voltage and/or current supplied to) the processor 172, and a temperature of the illumination ballast unit 130. The runtime data may be acquired at any time, or its acquisition may be triggered in accordance with a predetermined schedule or events. For example, acquisition of the runtime data may be scheduled to occur at a predetermined interval, or one or more acquisition of the runtime data may be triggered by the sensing of one or more predefined events, e.g., dimming or failure of a light emitting element.

Construction of a model of the lighting system in operation 214 may be performed in accordance with the following processes. In a particular embodiment, the test data acquired in operation 212 is arranged in instances of an attribute/operating state pair. Each instance may be represented as:

$$[X|y], |X|=k$$

where X is a vector consisting of one or more attributes (i.e. test data measured by the sensors 174); y is the health state at the time the values of X are recorded or the health state that triggered the recording of X; and k is the number of attributes. Furthermore, $$X = \begin{bmatrix} x_1 \\ x_2 \\ \ldots \\ x_i \\ \ldots \\ x_k \end{bmatrix},$$

and $x_i \in \{\Re|[0, 1]|[\text{Categorical list of values}]\}$, the values of the attributes x may be real values, binary value or categorical (string) values. Similarly, the operating state value could also be real, binary or categorical values $y \in \{\Re |[0,1]| [\text{Categorical list of values}]\}$.

At the conclusion of operation 212, the data collected may be expressed as:

$$[X^n|Y], |Y|=m$$

where n is the total number of instances in the collected data set and m is the total number of states which could be two when the binary states are being considered, or it could be infinite in the case of real valued states are considered or a finite value when dealing with categorical state values.

As a part of operation 214, the data sets $[X^n|Y]$ are mined, and patterns are formed whereby health states Y are determined as a function of the values or the attributes in vectors X. The data mining operation is conducted such that:

$$Y=M(X^n): \text{error}(y=M(X_{unknown})) \to 0, \text{ with}$$
$$X_{unknown} \notin X^n \text{ and } y \in Y$$

As indicated, the model of the lighting system M is constructed such that it is operable to correctly map runtime data (i.e., attribute values of $X_{unknown}$) to the correct operating state value Y of the on-line operating system, as performed in operation 218. Several mapping algorithms may be employed to provide this convergence. For example, computational intelligence models such as Adaptive Resonance Theory; Back Propagation Learning; Instance Based Learning, Nearest Neighbor, Case-Based Reasoning; and Support Vector Machines SVM, Kernel Methods, PCA, ICA may be employed, although other mapping techniques and algorithms such as Hopfield's Associative Memory; Kohnonen's Self Organizing Maps, Pulsed Neural Networks; Radial Basis Functions; Real Time Recurrent Learning; Reinforcement Learning, and Statistical Methods, such as Bayesian and Monte Carlo algorithms may be used as well.

Once the modelling error has been reduced to an acceptable degree, the model is implemented (e.g., in the memory of the processor 172), where it receives the input of runtime data in operation 216, and outputs the present operating state of the on-line lighting system in operation 218.

Optionally, an additional filtering process may be employed in operation 214 in parallel with the modelling process. In such an instance, vector X having k attributes may be filtered, resulting in a filtered vector $X_{fl}$. The filtered vector $X_{fl}$ may be correlated with a particular health state y, the result of such correlation classified in a predefined class C. The correlation C may be used to provide a pattern for mapping subsequent vectors $X_{fl}$ to the health state y. The filtering process may be further operable to provide an output indicating the filtered vector $X_{fl}$, the predicted health state y produced by the filtered vector $X_{fl}$, and additional information E, such as text string or message (indicating the previous health state, rate of degradation, etc.). The filtering process may thus be described in the following operations:

$$X_{fl}=f(X) \to C=Y(X_{fl}) \to \text{Pattern}(X_{unknown},y,E)$$

The foregoing method may provide advantages over the aforementioned conventional modeling approaching, in that the conditions under which the operating components are subjected are the actual operating conditions of the lighting system in the present light monitoring system, as opposed to simulated conditions in the conventional aging technique. The present light monitoring system provides a technique in which test data, including power (voltage/current), temperature, and lighting conditions (luminescence, color intensity), is obtained from the implemented system components, and accordingly, the model derived therefrom will be very accurate in predicting system aging.

The method may provide another advantage, in that the model of the lighting system may be updated to reflect the most recent trends in the aging processes of the components. Further advantageously, the predictive model of the lighting system includes the correlated aging effects between operating components, and in particular, the correlated aging effect between the light emitting elements and the non-light emitting elements. In the above-mentioned conventional system, aging characteristics of the individual components was provided, and the influence of one component on the aging of another component was not discernable. The model includes these correlated effects, resulting in a more accurate predictive model of the lighting system.

In one application, the monitoring system is used to monitor the operating state of an LED lighting system in an aircraft in accordance with the illustrated system and method presented in FIGS. 1 and 2 above. Such a monitoring system may be advantageously deployed to detect aging or failure of an LED strip, which could disturb the intended lighting effect in the aircraft's cabin. The monitoring system may also be used to accurate predict the MTTF of a particular LED strip or LED matrix, and to schedule maintenance of the system accordingly. In so doing, failing LEDs may be replaced in a more timely manner, and overall maintenance performed more economically.

As readily appreciated by those skilled in the art, the described processes may be implemented in hardware, software, firmware or a combination of these implementations as appropriate. In addition, some or all of the described processes may be implemented as computer readable instruction code resident on a computer readable medium (removable disk, volatile or non-volatile memory, embedded processors, etc.), the instruction code operable to program a computer of other such programmable device to carry out the intended functions.

According to an embodiment, a method for monitoring the operating health of a lighting system having a plurality of operating components includes acquiring test data from a plurality of operating components at a plurality of different operating states of the lighting system, whereby a data set is acquired for each operating state of the lighting system, and wherein a plurality of data sets are acquired. A model of the lighting system is constructed using the plurality of data sets, the model configured to indicate an operating state based upon the input of runtime data from the lighting system. Runtime data is next acquired from the lighting system and applied to the model of lighting system, the modeled system outputting data indicative of the operating state of the lighting system.

The foregoing description has been presented for purposes of illustration and description. It is not intended to be exhaustive or to limit the light monitoring system to the precise form disclosed, and obviously many modifications and variations are possible in light of the disclosed teaching. The described embodiments were chosen in order to best explain the principles of the light monitoring system and its practical application to thereby enable others skilled in the art to best utilize the light monitoring system in various embodiments and with various modifications as are suited to the particular use contemplated. It is intended that the scope of the light monitoring system be defined solely by the claims appended hereto.

It should be noted that the term "comprising" does not exclude other features, and the definite article "a" or "an" does not exclude a plurality, except when indicated. It is to be further noted that elements described in association with different embodiments may be combined. It is also noted that reference signs in the claims shall not be construed as limiting the scope of the claims. The term "coupling" is used to indicate either a direct connection between two features, or an indirect connection, via an intervening structure, between two features. Operations illustrated in flow charts are not limited to the particular sequence shown, and later numbered operations may be performed currently with, or in advance of earlier number operations in accordance with the light monitoring system.

Alternative combinations and variations of the examples provided will become apparent based on this disclosure. It is not possible to provide specific examples for all of the many possible combinations and variations of there embodiments described, but such combinations and variations may be claims that eventually issue.

The invention claimed is:

1. A method for monitoring the operating state of a lighting system, comprising:
   acquiring test data from a plurality of operating components of the lighting system at a plurality of different operating states of the lighting system, whereby a set of test data is acquired for each operating state of the lighting system;
   constructing a model of the lighting system using said plurality of test data sets;
   acquiring runtime data from the lighting system; and
   applying the runtime data to the model of the lighting system, wherein the model of the lighting system is operable to output operating state data responsive to input of operating data, whereby the operating state data indicates an operating health of the lighting system,
      wherein the step of acquiring test data includes selecting the plurality of operating components of the lighting system to include an illumination ballast unit comprising a processor, the illumination ballast unit having a first input coupled to a cabin inter communication data system for receiving commands for setting power delivered to at least one of a plurality of light emitting elements, a second input coupled to a power supply for receiving power and an output coupled to the at least one of the plurality of the light emitting elements, and
      includes selecting from a group of test data consisting of a command signal supplied to the first input, a current supplied to the second input, a voltage supplied at the second input, a temperature of the processor, a power consumption of the processor, and a temperature of the illumination ballast unit.

2. The method of claim 1, wherein the step of acquiring test data includes selecting the plurality of operating components of the lighting system to include at least one light emitting element and at least one non-light emitting element.

3. The method of claim 1,
   wherein the step of acquiring test data includes selecting the plurality of operating components of the lighting system to include at least one light emitting element, and includes selecting the acquiring test data from the group of test data consisting of a luminescence of the light emitting element, an intensity of the light emitting element, a current supplied to the light emitting element, a voltage developed across the light emitting element, and an operating temperature of the light emitting element.

4. The method of claim 1, wherein the step of acquiring test data includes selecting the operating states of each of the plurality of operating components to comprise at least one normal state and at least one faulty state.

5. The method of claim 1,
   wherein the step of acquiring test data includes selecting the plurality of operating components of the lighting system to comprise at least one light emitting element, and
   wherein the step of acquiring runtime data includes selecting runtime data from the group of runtime data consisting of a luminescence of the light emitting element, an intensity of the light emitting element, a current supplied to the light emitting element, a voltage developed across the light emitting element, and an operating temperature of the light emitting element.

6. A method comprising: monitoring an aircraft lighting system using the method of claim 1.

7. A method for monitoring the operating state of a lighting system, comprising:
   acquiring test data from a plurality of operating components of the lighting system at a plurality of different operating states of the lighting system, whereby a set of test data is acquired for each operating state of the lighting system;
   constructing a model of the lighting system using said plurality of test data sets;
   acquiring runtime data from the lighting system; and
   applying the runtime data to the model of the lighting system, wherein the model of the lighting system is operable to output operating state data responsive to input of operating data, whereby the operating state data indicates the operating health of the lighting system,
      wherein the step of acquiring test data includes selecting the plurality of operating components of the lighting system to comprise an illumination ballast unit having a first input coupled to a cabin inter communication data system for receiving commands for setting power delivered to at least one of a plurality of light emitting elements, a second input coupled to a power supply for receiving power and an output coupled to the at least one of the
   plurality of the light emitting elements, the illumination ballast unit comprising a processor, and
   the step of acquiring runtime data includes selecting data from the group of runtime data consisting of a command signal supplied to the first input, a current supplied to the second input, a voltage supplied at the second input, a temperature of the processor, a power consumption of the processor, and a temperature of the illumination ballast unit.

8. The method of claim 7, wherein the step of acquiring runtime data from the lighting system includes acquiring runtime data at a predefined time interval.

9. The method of claim 7, wherein the step of acquiring runtime data from the lighting system includes acquiring runtime data from the lighting system upon sensing a predefined operating condition.

10. A system operable to monitor an operating health of a lighting system having a plurality of operating components, the system comprising: a plurality of sensors operable to acquire data from the plurality of operating components; and
a processor coupled to the plurality of the sensors, the processor operable to acquire test data from the plurality of sensors and operable to construct a model of the lighting system using the acquired test data, the processor further operable to acquire runtime data of the lighting system from sensors, and to output operating state data indicating the operating health of the lighting system responsive to acquiring the runtime data of the lighting system, wherein the plurality of operating components of the lighting system include an illumination ballast unit comprising a processor, the illumination ballast unit having a first input coupled to a cabin inter communication data system for receiving a command signal for setting power delivered to at least one of a plurality of light emitting elements, a second input coupled to a power supply for receiving power and an output coupled to the at least one of the plurality of the light emitting elements, the acquired test data consisting of test data selected from the group of test data consisting of the command signal supplied to the first input, a current supplied to the second input, a voltage supplied at the second input, a temperature of the processor, a power consumption of the processor, and a temperature of the illumination ballast unit,
whereby a set of test data is acquired for each operating state.

11. The system of claim 10,
wherein the plurality of operating components of the lighting system monitored by the system includes at least one light emitting element and an illumination ballast unit, the illumination ballast unit having a first input coupled to a cabin inter communication data system for receiving commands for setting power delivered to at least one of a plurality of light emitting elements, a second input coupled to a power supply for receiving power and an output coupled to the at least one of the plurality of the light emitting elements, and
wherein the plurality of sensors are operable to sense runtime data selected from the group of data consisting of a luminescence of the light emitting element, an intensity of the light emitting element, a current supplied to the light emitting element, a voltage developed across the light emitting element, an operating temperature of the light emitting element, a command signal supplied to the first input, a voltage supplied to the second input of the illumination ballast unit, a current supplied to the second input of the illumination ballast unit, and the temperature of the illumination ballast unit.

12. An aircraft lighting system, comprising:
at least one light emitting element; and
a monitoring system as claimed in claim 10.

13. A computer program product, resident on a computer readable medium, for providing instruction code to monitor an operating health of a lighting system having a plurality of operating components, the computer program product comprising:
instruction code to acquire test data from the plurality of operating components at a plurality of different operating states of the lighting system, wherein a plurality of test data sets is acquired for each operating state of the lighting system;
instruction code to construct a model of the lighting system using the plurality of test data sets;
instruction code to acquire runtime data from the lighting system; and
instruction code to apply the runtime data to the model of the lighting system, wherein the model of the lighting system is operable to output operating state data responsive to the input of operating data, whereby the operating state data indicates the operating health of the lighting system, wherein the instruction code of acquiring test data includes selecting the plurality of operating components of the lighting system to include an illumination ballast unit comprising a processor, the illumination ballast unit having a first input coupled to a cabin inter communication data system for receiving commands for setting power delivered to at least one of a plurality of light emitting elements, a second input coupled to a power supply for receiving power and an output coupled to the at least one of the plurality of the light emitting elements, and
includes selecting from a group of test data consisting of a command signal supplied to the first input, a current supplied to the second input, a voltage supplied at the second input, a temperature of the processor, a power consumption of the processor, and a temperature of the illumination ballast unit.

\* \* \* \* \*